United States Patent
Boutigny et al.

(10) Patent No.: US 9,537,222 B2
(45) Date of Patent: Jan. 3, 2017

(54) METHOD FOR DEFINING THE STRUCTURE OF A KA BAND ANTENNA

(71) Applicant: THALES, Neuilly-sur-Seine (FR)

(72) Inventors: Pierre Boutigny, Gennevilliers (FR); Laurent Collin, Gennevilliers (FR); Laurent Beguet, Gennevilliers (FR)

(73) Assignee: THALES, Courbevoie (FR)

( * ) Notice: Subject to any disclaimer, the term of this patent is extended or adjusted under 35 U.S.C. 154(b) by 214 days.

(21) Appl. No.: 14/580,048

(22) Filed: Dec. 22, 2014

(65) Prior Publication Data

US 2015/0180134 A1 Jun. 25, 2015

(30) Foreign Application Priority Data

Dec. 23, 2013 (FR) .................................... 13 03066

(51) Int. Cl.
| | |
|---|---|
| *H01Q 13/00* | (2006.01) |
| *H01Q 19/06* | (2006.01) |
| *H01Q 19/18* | (2006.01) |
| *H01Q 1/28* | (2006.01) |
| *H01Q 19/19* | (2006.01) |
| *H01Q 21/08* | (2006.01) |
| *G06F 17/50* | (2006.01) |

(52) U.S. Cl.
CPC ........ *H01Q 19/062* (2013.01); *G06F 17/5009* (2013.01); *H01Q 1/28* (2013.01); *H01Q 19/18* (2013.01); *H01Q 19/193* (2013.01); *H01Q 21/08* (2013.01)

(58) Field of Classification Search
CPC ...... H01Q 19/19; H01Q 19/062; H01Q 15/08; H01Q 19/17; H01Q 3/08; H01Q 15/16; H01Q 19/192;H01Q 3/04; H01Q 3/14; H01Q 1/125; H01Q 17/001; H01Q 19/10; H01Q 1/288; H01Q 1/1264
USPC ..................... 343/776, 777, 779, 781, 781 P, 781 R,343/781 CA, 836, 837
See application file for complete search history.

(56) References Cited

U.S. PATENT DOCUMENTS

| | | | | |
|---|---|---|---|---|
| 4,145,695 A | * | 3/1979 | Gans ..................... | H01Q 25/007 343/779 |
| 4,298,877 A | * | 11/1981 | Sletten ................. | H01Q 1/1264 343/781 CA |

(Continued)

FOREIGN PATENT DOCUMENTS

CA          385 262 A     11/1939

OTHER PUBLICATIONS

"Contiguos Paraboloid Arrays for Mobile Satellite Communications" by Peter C. Strickland; Institute of Electrical and Electronics Engineers; 2002 Digest; IEEE Antennas and Propagation Society International Symposium; Jun. 21, 2002, San Antonio, Texas; IEEE Operations Center, Piscataway, NJ; vol. 4, Jun. 16, 2002; pp. 724-727; XP010592527; DOI: 10.1109/APS.2002.1017085; ISBN: 978-0-7803-7330-3.

*Primary Examiner* — Linh Nguyen
(74) *Attorney, Agent, or Firm* — Baker & Hostetler LLP

(57) ABSTRACT

A method is provided for defining an antenna with weak sidelobes having at least two sources, in which the sources are regularly distributed and the reflectors have suitable shapes, obtained by the implementation of a specific algorithm, the reflectors being illuminated by sources composed of a single part. The obtained antenna will offer a gain close to 0 in the direction of the array lobes, so these will be as low as possible.

12 Claims, 8 Drawing Sheets

(56) References Cited

U.S. PATENT DOCUMENTS

| | | | |
|---|---|---|---|
| 4,827,277 A * | 5/1989 | Becker | H01Q 19/19 |
| | | | 343/781 P |
| 6,268,835 B1 | 7/2001 | Toland et al. | |
| 6,563,473 B2 | 5/2003 | Strickland | |
| 6,563,476 B1 | 5/2003 | Sheng-Gen et al. | |
| 6,603,437 B2 * | 8/2003 | Chang | H01Q 19/192 |
| | | | 343/781 CA |
| 7,205,949 B2 * | 4/2007 | Turner | H01Q 1/288 |
| | | | 343/779 |
| 2001/0045910 A1 * | 11/2001 | Gau | H01Q 15/16 |
| | | | 343/779 |
| 2002/0113744 A1 * | 8/2002 | Strickland | H01Q 15/16 |
| | | | 343/781 P |
| 2004/0108961 A1 * | 6/2004 | Hay | H01Q 13/0208 |
| | | | 343/781 CA |
| 2011/0267250 A1 | 11/2011 | Seifried et al. | |

* cited by examiner

METHOD FOR DEFINING THE STRUCTURE OF A KA BAND ANTENNA

CROSS-REFERENCE TO RELATED APPLICATION

This application claims priority to foreign French patent application No. FR 1303066, filed on Dec. 23, 2013, the disclosure of which is incorporated by reference in its entirety.

FIELD OF THE INVENTION

The subject of the invention relates to a method for defining the structure, dimensions and geometry of a planar multi-focus antenna operating in the Ka band, of corresponding small height allowing it to be installed in a radome on a carrier aircraft, for example. The invention is notably used for defining antennas operating in the Ka band using several sources of large size, greater than the wavelength, and arranged in a radome. The antenna and its positioner are arranged, for example, under a radome installed on an aeroplane of wide-bodied carrier type where the radome height is generally limited to 30 cm.

BACKGROUND

The Ka band is currently being deployed for high-speed satellite communications. It is characterized by a very high frequency, leading to difficulties in technological development, a very large separation of the emission frequencies Tx, about 20 GHz, and the reception frequencies Rx, about 30 GHz, and a large usable bandwidth in the order of 2 GHz. Many companies are developing antenna systems compatible with mobile applications, either ground-based or aeronautical.

The use of satellite dishes in communication systems is not adapted for mobiles because their height is excessive, incurring restrictions on displacement, inability to be used when these systems become outsized, etc. Additionally, in the field of high-speed satellite communications, the standardized environment is important. The power density emitted off-axis is regulated in order to avoid the scrambling of other satellites. This forces the antenna to have a pattern with low sidelobes or array lobes.

Most of the solutions developed by the prior art are imperfect and generally exhibit rises in the sidelobes in certain directions. These solutions are based on dense arrays of sources, but the very high emission frequency in the Ka band of 30 GHz imposes compromises in terms of source density. One of the solutions offered is based on a quincunx array, which is easier to construct but which exhibits wide array lobes.

In the prior art known to the Applicant, the antennas used operate in the Ku band. In the Ku band, two types of solution are used to produce such antennas.

A first type is the type A, as described in patent application US 2011/0267250 in which the dense arrays of elementary sources are of horn or slit type. The second type of solution is the type B in which the arrays are based on sources of large size, for example according to the patent U.S. Pat. No. 6,563,473. To avoid the presence of array lobes, the distance between elementary sources must be shorter than the wavelength, for example 1 cm in the Ka band. This condition is adequate but not necessary. It is also generally necessary for the power density over the whole surface of the antenna aperture to obey precise mathematical laws, and it is for example possible to use a uniform law which will not give rise to array lobes.

Solutions of type A are complicated in terms of application and expensive in the Ka band because:
- the array pitch of 1 cm leaves very little space for performing the operations,
- the number of sources is very high (1408) for a typical antenna of 22 cm by 64 cm,
- the separation of 10 GHz between the TX and RX frequencies as well as the bandwidth of 2 GHz impose solutions (relative band of 30%).

Type B solutions are easier to produce because they include fewer sources. As the separation between sources is greater than the wavelength, the presence of array lobes is generally permitted.

The U.S. Pat. No. 6,563,476 describes an antenna system working in the Ku band, the frequency band of which is twice as low, in which the separation between sources is irregular, for two or more than two sources.

The patent application US 2011/0267250 presents a solution that consists in bringing the sources closer together by asymmetrically shortening the reflectors. This solution works with two sources.

The prior art known to the Applicant does not describe any antenna with weak lobes having more than two sources.

SUMMARY OF THE INVENTION

One of the aims of the present invention is to supply an antenna of the aforementioned type B with weak sidelobes having at least two sources, in which the sources are regularly distributed and the reflectors have adapted shapes, obtained by the implementation of a specific algorithm, the reflectors being illuminated by sources composed of a single part. The obtained antenna will provide a gain close to 0 in the direction of the array lobes, so these will be as low as possible.

The subject relates to a method for determining the geometry of a planar multi-focus array antenna for the Ka band comprising at least two antenna elements, each antenna element comprising a reflector and a sub-reflector, at least one source powering said antenna elements, the method is characterized in that it comprises at least the following steps:
- defining a threshold value $G_{seuil}$ of the antenna gain,
- representing the surface of the sub-reflector and the surface of the reflector by a set of points $(X_S, Z_S)$ for the sub-reflector and $(X_{SR}, Z_{SR})$ for the reflector,
- generating from a suitable electromagnetic simulation module a set of pairs of values $\{(\theta_1, G_1) \ldots (\theta_n, G_n)\}$ corresponding to the direction of the radiation and to the antenna gains for each antenna element and for each set of points chosen to represent the surface of the sub-reflector and of the reflector at a position of the source,
- determining for each pair of values and from the pattern of an elementary source under consideration, the value of the maximum antenna gain in the direction of the array lobes,
- comparing the value of the maximum gain obtained, and if this value is above a threshold value, then varying at least one of the parameters $(X_{SR}, Z_{SR})$ for the sub-reflector and $(X_R, Z_R)$ for the reflector,
- determining the shape of the antenna from the points verifying the threshold values.

The invention also relates to a planar multi-focus array antenna for the Ka band comprising at least two antenna elements, each antenna element comprising a reflector and a sub-reflector, at least one source powering said antenna elements, the antenna having a threshold gain value characterized in that the antenna has a shape defined on the basis of points optimized for a given position P of the source and defined as follows:

the surface of the sub-reflector and the surface of the reflector are represented by a set of points (($X_S$, $Z_S$) for the sub-reflector and ($X_{SR}$, $Z_{SR}$) for the reflector), the surface of the sub-reflector and of the reflector at a position of the source are represented by a set of pairs of values $\{(\theta_1, G_1) \ldots (\theta_n, G_n)\}$ corresponding to the direction of the radiation and to the antenna gain, for each antenna element and for each set of chosen points, at least one of the parameters ($X_{SR}$, $Z_{SR}$) for the sub-reflector and ($X_R$, $Z_R$) for the reflector is modified as a function of the difference between the value of the maximum antenna gain in the direction of the array lobes determined for each pair of values and of the pattern of an obtained elementary source under consideration and a threshold value.

In a variant embodiment, a reflector revolving about a z-axis is used to define the points verifying the threshold values and defining the antenna, then a step is executed in which the reflectors are shortened to a width corresponding to the distance between two sources under consideration along a y-axis.

The method can also include the following steps: four power supplies are placed on a part containing the main multi-focus reflector, four sub-reflectors fastened to each power supply by means of a holding part, two combiners powering with right-hand circular or left-hand circular polarization a 20/30 GHz port with LHCP polarization, a 20/30 GHz port with RHCP polarization and one diplexing filter per port in order to obtain two emitting ports Tx for two polarizations.

According to one embodiment, the antenna includes four elements, the first antenna element having a rounded edge, and the fourth antenna element having a rounded edge on the parts that are not in contact with the other antenna elements.

The antenna includes, for example, masks between each source.

The antenna includes for example, four power supplies on one part containing the main multi-focus reflector, four sub-reflectors $SR_1$, $SR_2$, $SR_3$, $SR_4$ fastened to each feed by means of a holding part, two combiners powering with right-hand circular or left-hand circular polarization a 20/30 GHz port with LHCP polarization, a 20/30 GHz port with RHCP polarization and 1 diplexing filter per port in order to obtain two emitting ports Tx (20 GHz) for two polarizations and two receiving ports Rx (30 GHz) for two polarizations.

BRIEF DESCRIPTION OF THE DRAWINGS

Other features and advantages of the device according to the invention will become apparent on reading the following description of an exemplary, non-limiting embodiment given for illustrative purposes, with the appended figures in which.

DETAILED DESCRIPTION

Figure 1:
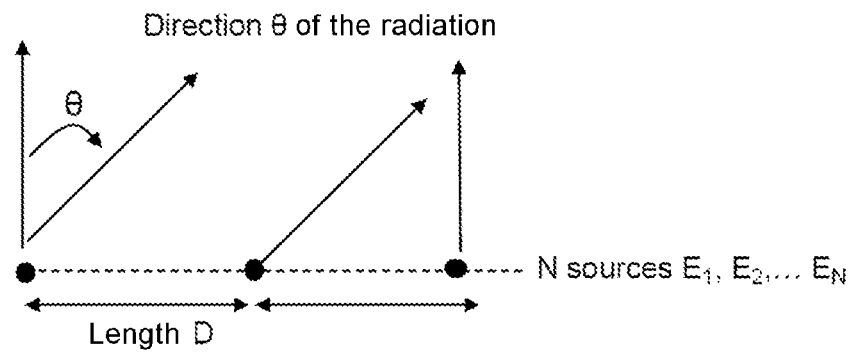
FIG. 1 represents a representation of the formation of array lobes.

In order to make it easier to understand the subject of the invention, the detailed description is given in the case of an antenna comprising four source elements. FIG. 1 is a diagram of the direction 8 of the radiation from a source in an array of sources Ei spaced by a distance D. Such an array will generate array lobes, the angular positions of which are given by:

$$\sin(\theta) = N \lambda/D$$

N: integer>0
λ: wavelength
D: distance between sources

For example, for a frequency G=30 GHz and a distance D of 16 cm, the first array lobes are multiples of 3.6°. The amplitude of these lobes is determined by the gain of an elementary source in the direction of the array lobe i.e. in the directions 3.6°, 7.2°, 10.8° in this exemplary embodiment.

Figure 2:
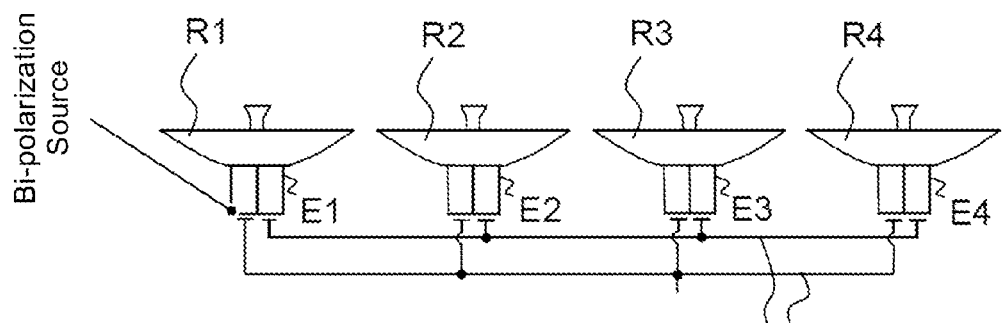
FIG. 2 represents an example given for an antenna with four elements.
Figure 3:
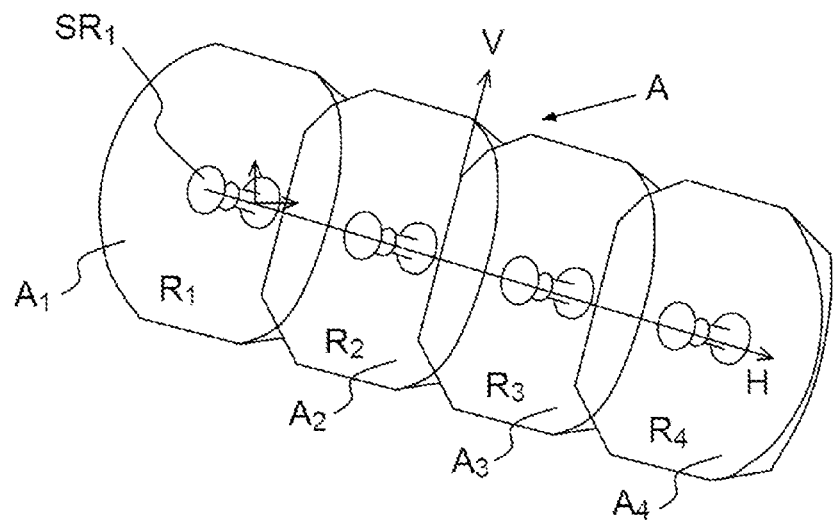
FIG. 3 represents a view of the antenna in FIG. 2.

FIG. 2 and FIG. 3 are diagrams of an example of an antenna system A comprising four elements $A_1$, $A_2$, $A_3$, $A_4$. An element Ai is composed notably of a radiating element Ei, of a wave reflector Ri that will illuminate a satellite to infinity, and of a sub-reflector SRi, the function of which is to illuminate the reflector.

The antenna elements Ai are, for example, composed of antennas with reflectors Ri, the excitation part of which is formed of a bipolarized radiating element Ei with left-hand circular polarization LHCP and right-hand circular polarization RHCP with two ports, as represented in FIG. 2.

Each set of ports of the same polarization is connected, for example, by a waveguide distributor 21 to form the general port of the antenna A. Thus there are two main ports: a left-hand polarization port LHCP and a right-hand polarization port RHCP.

The method according to the invention notably has the aim of generating an antenna geometry, and its antenna of definite dimensions which will make it possible to obtain a gain G close to 0 in the direction of the array lobes. The gain of the source will be reduced in the desired directions.

Figure 5:
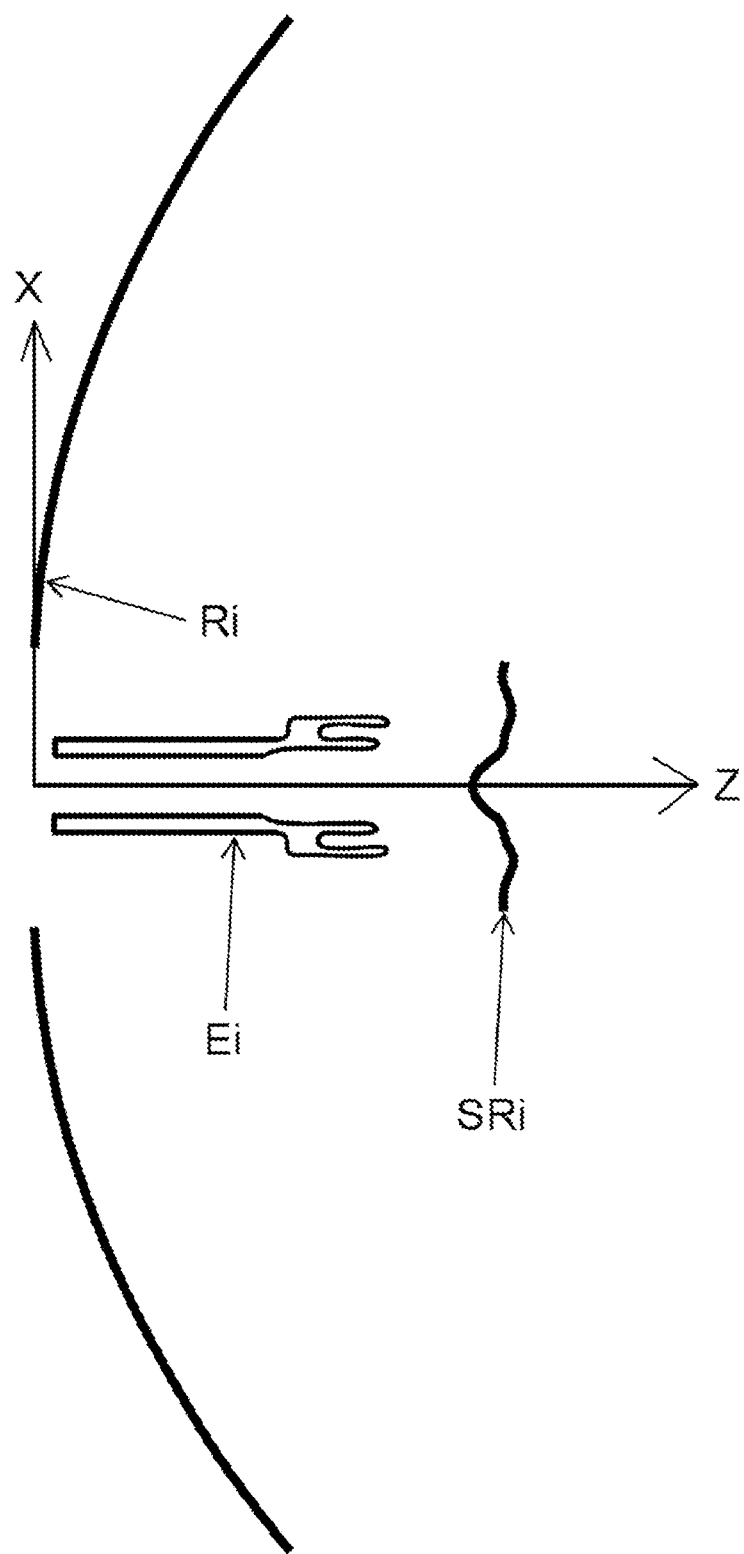
FIG. 5 represents a definition of an elementary source after the execution of the method according to the invention.

The geometry of the surfaces of an antenna element Ai will be represented by pairs of points in a pattern X, Z (FIG. 5).

A radiating element Ei or source is defined by an elementary point P.

A set of points ($X_{SR}$, $Z_{SR}$) called control points is defined for a sub-reflector SR and a set of control points ($X_R$, $Z_R$) is defined for a reflector R.

These chosen points are entered into an electromagnetic simulation software program in order to obtain a file containing pairs of values (θ, G), corresponding to the direction of the radiation and to the antenna gain. A set of pairs $\{(\theta_1, G_1) \ldots (\theta_n, G_n)\} \ldots$ is obtained for each pair of the set of selected points, this being done for the control points relating to the sub-reflector and for the control points for the reflectors.

The maximum possible gain will be sought as a function of the angle of view and the pattern of the elementary source.

To do this, a software program will be used that is suitable for determining the position of the aforementioned modelling points, enabling the cancellation of the gain of the source in the desired directions. An attempt is made to optimize the radiation pattern of a source so that the gain of the source is weak in the directions of the array lobes. To do this, the position of each previously fixed point will be optimized to define the shape of the sub-reflector and the shape of the reflector for a given position P of the source.

The radiation pattern of the elementary source is known as a function of an angle θ of view. The maximum gain of the source is computed, and is compared to a threshold value $G_{seuil}$, and if the gain exceeds this threshold value, then one of the parameters ($X_{SR}$, $Z_{SR}$) is varied for the sub-reflector and/or ($X_R$, $Z_R$) for the reflector.

The sidelobes will be present but weak because the gain of each elementary source will be weak in the direction under consideration.

In the given example, the optimized variables are:

| zhorn | Position of the horn or source |
|---|---|
| $Z_{SR1} \ldots Z_{SR7}$ | 7 Z-control points for the sub-reflector |
| $Z_{R1} \ldots Z_{R4}$ | 4 Z-control points for the main reflector |

Figure 4:
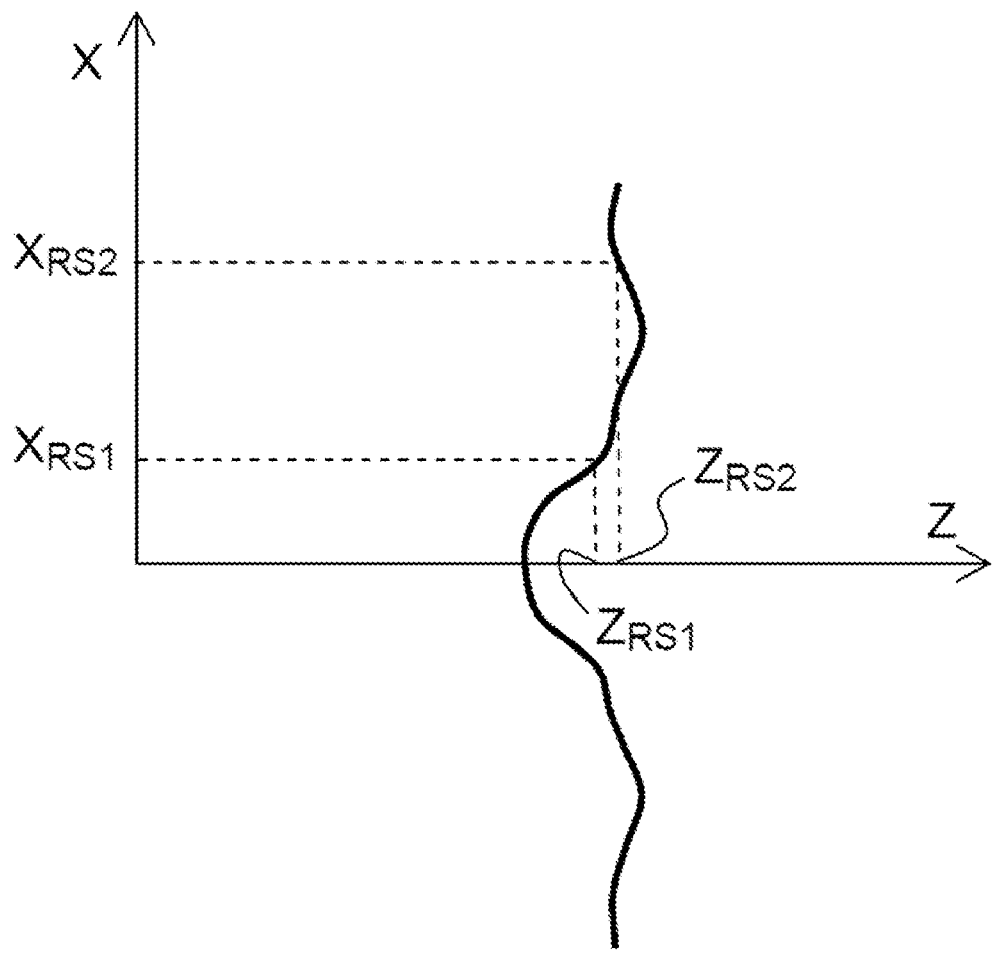
FIG. 4 represents a representation of control points for the definition of the sub-reflector.

The reflectors revolve about the z-axis, then are shortened to the width D (distance between two sources) on the y-axis. Thus after optimization of the geometry of an antenna element, shapes are obtained for the reflectors and the sub-reflectors which notably deviate from conventional geometries, notably that of the sub-reflector which exhibits notable fluctuations represented in FIG. 5 for the chosen control points, according to FIG. 4.

Figure 6:
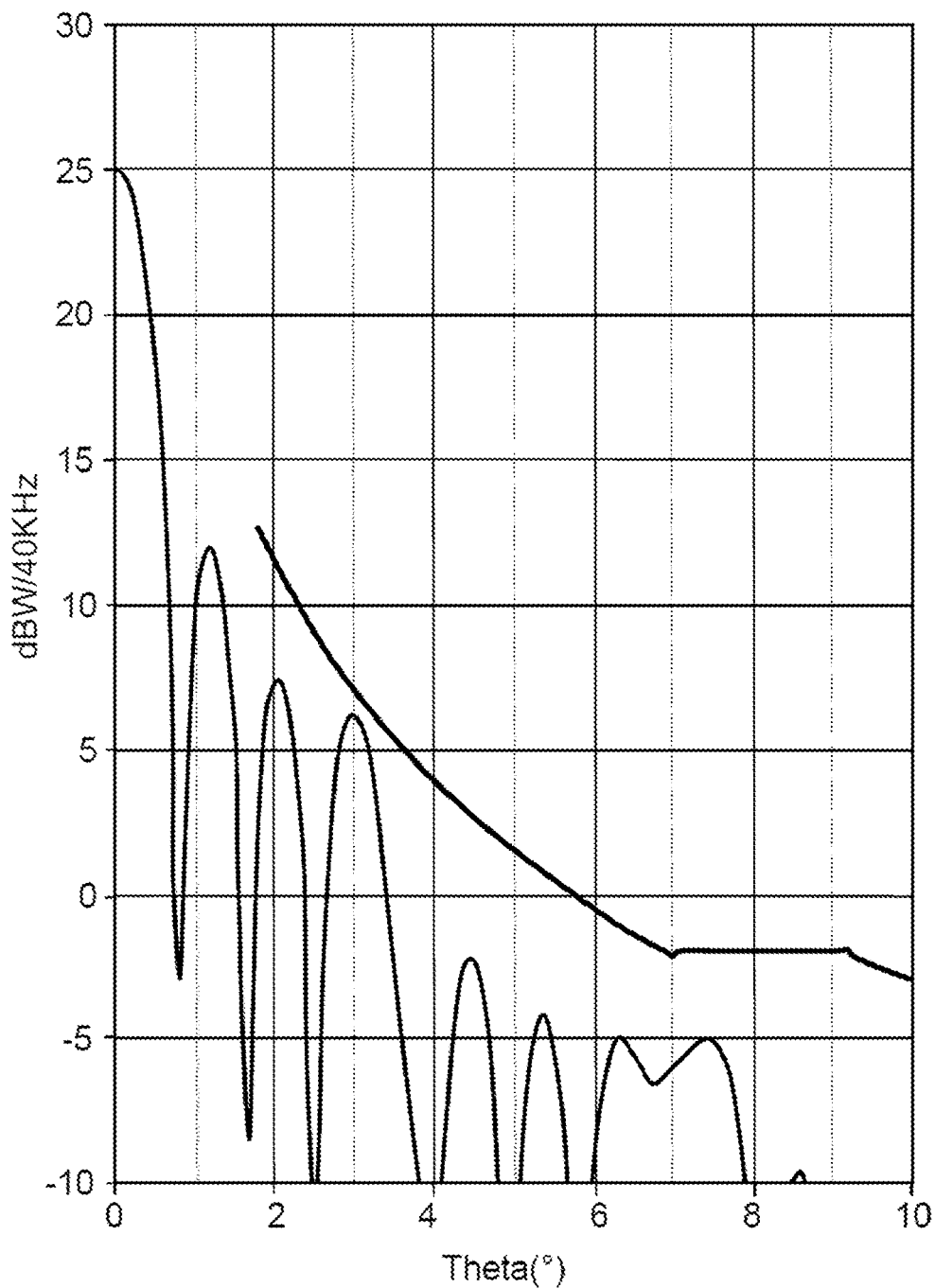
FIGS. 6 and 7 represent the emission pattern obtained in the H plane and the V plane.
Figure 7:
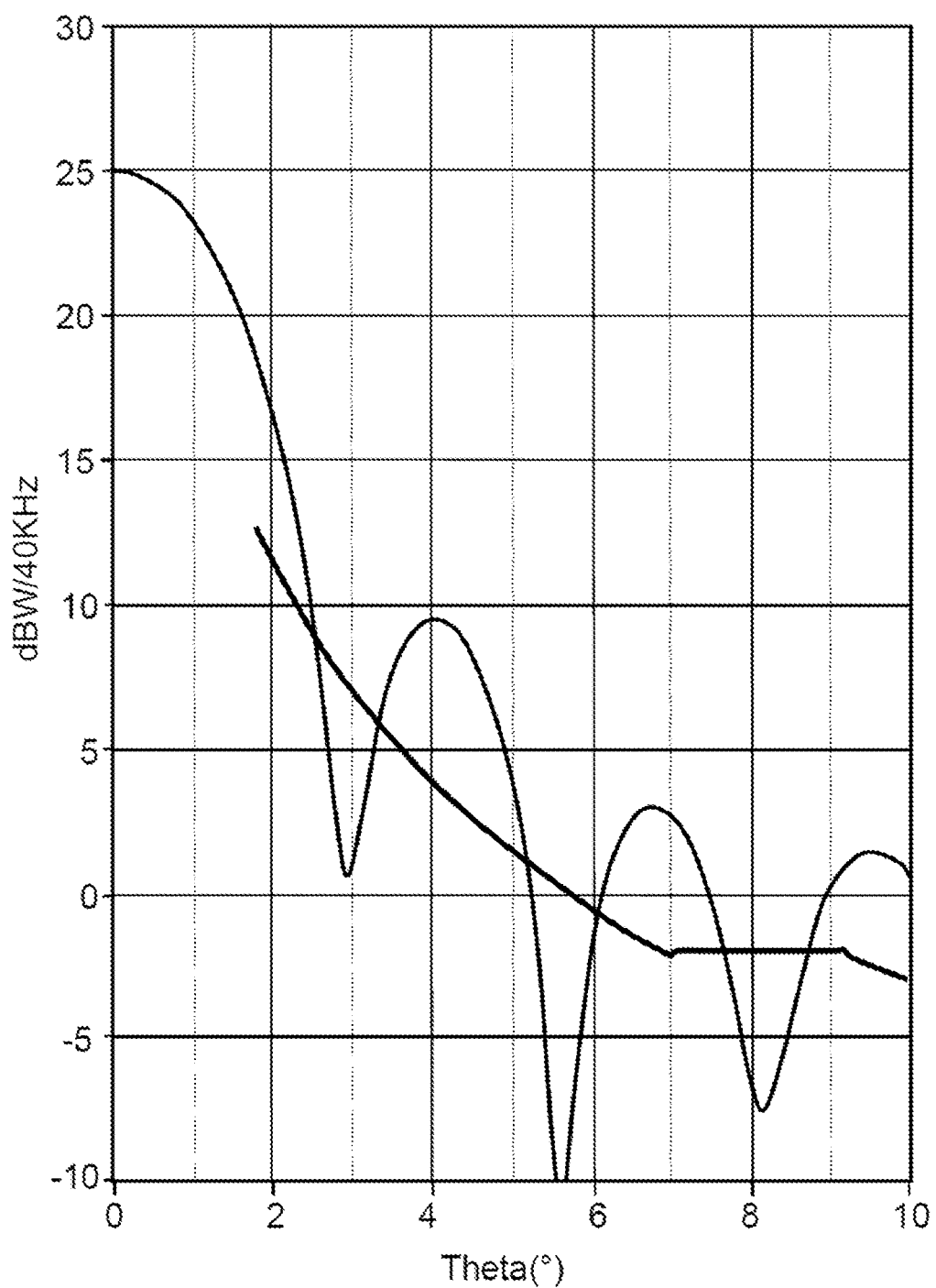
Figure 8:
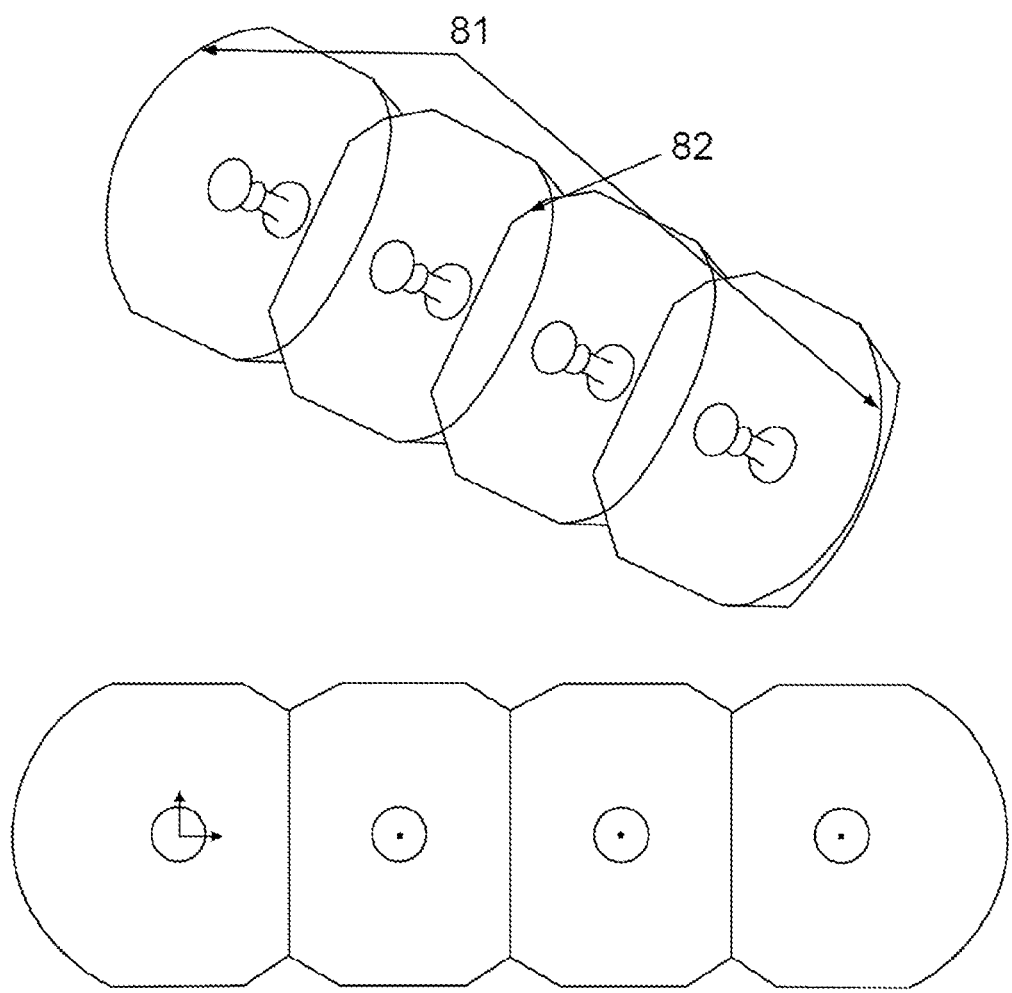
FIG. 8 represents a variant embodiment of the antenna in FIG. 2, FIG. 9 and FIG. 10 represent a diagram showing the connection of the antenna elements.

FIGS. 6 and 7 show the results obtained for an antenna with four sources or antenna elements of an overall size of 64 cm (H plane) by 22 cm (V plane). It is noted that the array lobes do not appear in the H plane. In the V plane the pattern is wider because the antenna is of smaller size (22 cm).

On the basis of the pattern obtained for the first antenna element, the other patterns are derived for the three other antenna elements.

It will then be verified that the whole of the system composed of four antenna elements has a gain that is above a minimum gain value Gmin for an angle of view of 0° along the axis of the antenna, and is less than a value Ga for a given angle a, this being the case for several angle values that will have been chosen in advance according to a method well-known to those skilled in the art.

In a variant embodiment, it is possible to insert masks between each source in order to improve the performance of the antenna. This makes it possible to avoid the illumination of a source by another source and improves the diffuse lobes.

In another variant embodiment, the first source and the last source of the array exhibit rounded edges on the part that is not in contact with the other sources of the array. This notably allows a less steep weighting on the edges and improves the radiation pattern.

The elementary source of the antenna being of small size, in certain cases in the order of 16 cm by 22 cm, a wave source better known by the term "feed" of small size will be used to illuminate the reflector.

The wave source used is, for example, produced as a single mechanical part. The functions of this part are notably as follows: two wideband 20 GHz and 30 GHz ports for two circular polarizations, a circular polarization plate, a corrugated horn making it possible to illuminate the sub-reflector, and fastenings for mounting a sub-reflector support and for fastening the feed to the back of the antenna.

Figure 9:
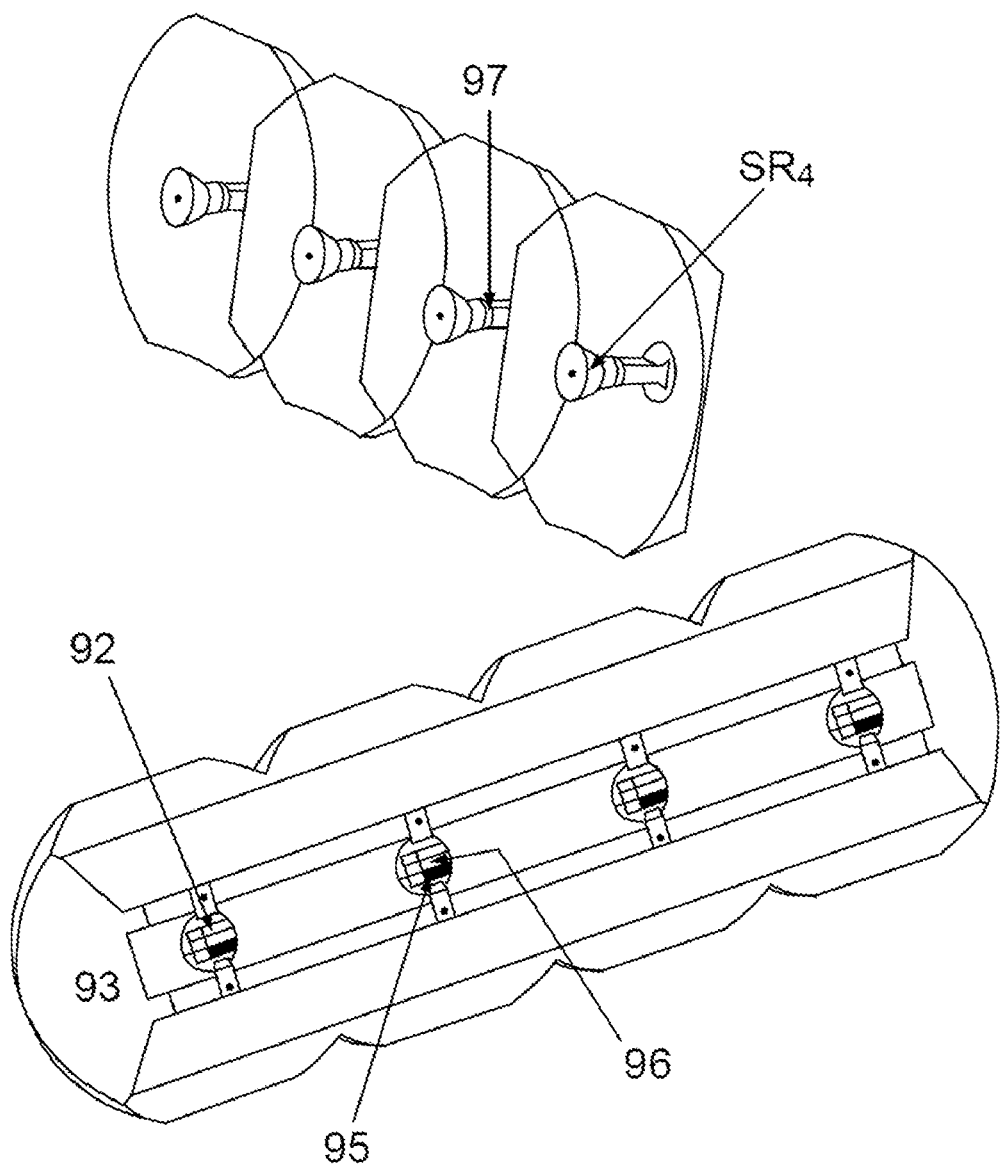
Figure 10:
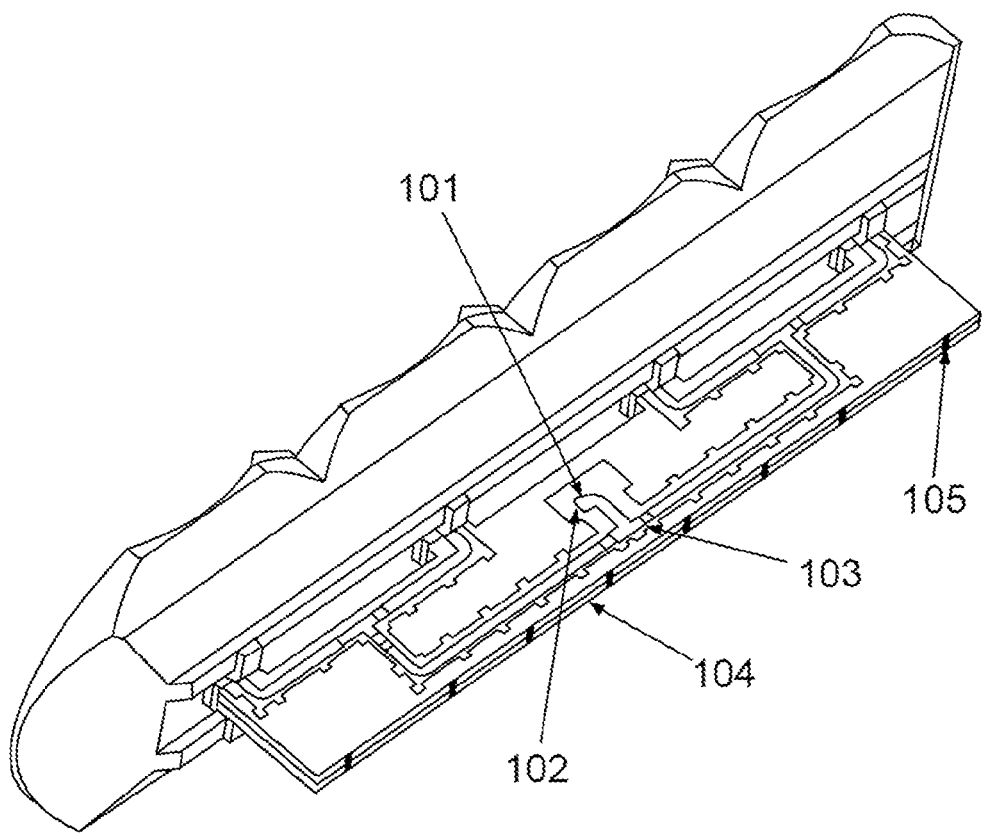

FIG. 9 is a diagram of an example of assembly of the radiating part of the antenna. The antenna is obtained in this example by assembling four power supplies or feeds 92 on a part 93 containing the main multi-focus reflector 94. The four sub-reflectors $SR_1$, $SR_2$, $SR_3$, $SR_4$ are fastened to each feed by means of a holding part 97 made of epoxy, for example. On the back face of the antenna eight ports are obtained, or four for each polarization. The FIG. 10 is a diagram of the back face of the antenna. Each group of four ports is connected, for example, by a combiner obtained by machining a thick plate sealed by a soldered lid 105 (FIG. 10). By using two combiners 103, 104 to power with right-hand or left-hand circular polarization, the two main ports of the antenna are obtained:

a 20/30 GHz port with LHCP polarization, 96,
a 20/30 GHz port with RHCP polarization, 95.

By using two diplexing filters, one per port, it is finally possible to obtain:

two emitting ports Tx (20 GHz) for two polarizations,
two receiving ports Rx (30 GHz) for two polarizations.

ADVANTAGES

The method and the antenna obtained by the implementation of the method notably exhibit the following advantages:

a low-cost and wideband antenna for the wave projector, the reflectors being easy to produce, and the monobloc power block reduces the assembly cost,
simultaneous emission and reception,
choice of polarizations at emission and reception,
operation in civil and military Ka coverage,
the possibility of isolating the multi-focus reflector using masks.

The invention claimed is:

1. A method for determining the geometry of a planar multi-focus array antenna for the Ka band comprising at least two antenna elements, each antenna element comprising a reflector and a sub-reflector, at least one source powering said antenna elements, the method comprising at least the following steps:

defining a threshold value $G_{seuil}$ of the antenna gain,
representing the surface of the sub-reflector and the surface of the reflector by a set of points (($X_S$, $Z_S$) for the sub-reflector and ($X_{SR}$, $Z_{SR}$) for the reflector),
generating from a suitable electromagnetic simulation module a set of pairs of values $\{(\theta_1, G_1) \ldots (\theta_n, G_n)\}$ corresponding to the direction of the radiation and the antenna gain for each antenna element and for each set of points chosen to represent the surface of the sub-reflector and of the reflector at a position of the source,
determining for each pair of values and from the pattern of an elementary source under consideration, the value of the maximum antenna gain in the direction of the array lobes,
comparing the value of the maximum gain obtained, and if this value is above a threshold value, then varying at least one of the parameters (($X_{SR}$, $Z_{SR}$) for the sub-reflector and ($X_R$, $Z_R$) for the reflector),
determining the shape of the antenna from the points verifying the threshold values.

2. The method according to claim 1, wherein two circular polarizations are used.

3. The method according to claim 1, wherein a reflector revolving about a z-axis is used to define the points verifying the threshold values and defining the antenna, then a step is executed in which the reflectors are shortened to a width D corresponding to the distance between two sources under consideration along a y-axis.

4. The method according to claim 2, wherein a reflector revolving about a z-axis is used to define the points verifying the threshold values and defining the antenna, then a step is executed in which the reflectors are shortened to a width D corresponding to the distance between two sources under consideration along a y-axis.

5. The method according to claim 1, further comprising the following steps:
four power supplies are placed on a part containing the main multi-focus reflector, four sub-reflectors fastened to each power supply by means of a holding part, two combiners powering with right-hand circular or left-hand circular polarization a 20/30 GHz port with LHCP polarization, a 20/30 GHz port with RHCP polarization and one diplexing filter per port in order to obtain two emitting ports Tx (20 GHz) for two polarizations.

6. The method according to claim 2, further comprising the following steps:
four power supplies are placed on a part containing the main multi-focus reflector, four sub-reflectors fastened to each power supply by means of a holding part, two combiners powering with right-hand circular or left-hand circular polarization a 20/30 GHz port with LHCP polarization, a 20/30 GHz port with RHCP polarization and one diplexing filter per port in order to obtain two emitting ports Tx (20 GHz) for two polarizations.

7. The method according to claim 3, further comprising the following steps: four power supplies are placed on a part containing the main multi-focus reflector, four sub-reflectors fastened to each power supply by means of a holding part, two combiners powering with right-hand circular or left-hand circular polarization a 20/30 GHz port with LHCP polarization, a 20/30 GHz port with RHCP polarization and one diplexing filter per port in order to obtain two emitting ports Rx (20 GHz) for two polarizations.

8. A planar multi-focus array antenna for the Ka band comprising at least two antenna elements, each antenna element comprising a reflector and a sub-reflector, at least one source powering said antenna elements, the antenna having a threshold gain value wherein the antenna has a shape defined on the basis of points optimized for a given position P of the source and defined as follows:
the surface of the sub-reflector and the surface of the reflector are represented by a set of points (($X_S$, $Z_S$) for the sub-reflector and ($X_{SR}$, $Z_{SR}$) for the reflector),
the surface of the sub-reflector and of the reflector at a position of the source are represented by a set of pairs of values $\{(\theta_1, G_1) \ldots (\theta_n, G_n)\}$ corresponding to the direction of the radiation and to the antenna gain, for each antenna element and for each set of chosen points,
at least one of the parameters (($X_{SR}$, $Z_{SR}$) for the sub-reflector and ($X_R$, $Z_R$) for the reflector) is modified as a function of the difference between the value of the maximum antenna gain in the direction of the array lobes determined for each pair of values and of the pattern of an obtained elementary source under consideration and a threshold value.

9. The planar multi-focus array antenna according to claim 8, further comprising the reflectors of revolution about a z-axis, then shortened to the width D corresponding to the distance between two sources under consideration along a y-axis.

10. The planar multi-focus array antenna according to claim 8, further comprising four elements, the first antenna element having a rounded edge, and the fourth antenna element having a rounded edge on the parts that are not in contact with the other antenna elements.

11. The planar multi-focus array antenna according to claim 8, further comprising masks between each source.

12. The planar multi-focus array antenna according to claim 8, further comprising four power supplies on one part containing the main multi-focus reflector, four sub-reflectors fastened to each feed by a holding part, two combiners powering with right-hand circular or left-hand circular polarization a 20/30 GHz port with LHCP polarization, a 20/30 GHz port with RHCP polarization and one diplexing filter per port in order to obtain two emitting ports Tx (20 GHz) for two polarizations and two receiving ports Rx (30 GHz) for two polarizations.

* * * * *